(12) United States Patent
Wong et al.

(10) Patent No.: US 11,068,060 B2
(45) Date of Patent: Jul. 20, 2021

(54) LOW-PRESSURE CAPACITIVE TACTILE SENSOR AND METHOD FOR FABRICATING THE SAME

(71) Applicant: Nano and Advanced Materials Institute Limited, Hong Kong (HK)

(72) Inventors: Ka Ming Wong, Hong Kong (CN); Wendan Liu, Hong Kong (CN); Li Fu, Hong Kong (HK); Yong Zhu, Hong Kong (CN)

(73) Assignee: Nano and Advanced Materials Institute Limited, Hong Kong (HK)

( * ) Notice: Subject to any disclaimer, the term of this patent is extended or adjusted under 35 U.S.C. 154(b) by 0 days.

(21) Appl. No.: 16/714,774

(22) Filed: Dec. 15, 2019

(65) Prior Publication Data

US 2020/0201439 A1    Jun. 25, 2020

Related U.S. Application Data

(60) Provisional application No. 62/917,644, filed on Dec. 21, 2018.

(51) Int. Cl.
| | |
|---|---|
| *G06F 3/045* | (2006.01) |
| *G06F 3/01* | (2006.01) |
| *H03K 17/96* | (2006.01) |
| *G06F 3/0488* | (2013.01) |

(52) U.S. Cl.
CPC .......... *G06F 3/016* (2013.01); *G06F 3/04886* (2013.01); *H03K 17/962* (2013.01); *H03K 2017/9613* (2013.01); *H03K 2217/96062* (2013.01); *H03K 2217/960755* (2013.01)

(58) Field of Classification Search
USPC ................. 345/156, 173, 174, 177
See application file for complete search history.

(56) References Cited

U.S. PATENT DOCUMENTS

| | | | |
|---|---|---|---|
| 2011/0108936 A1* | 5/2011 | Meng ............... | G01L 1/005 257/419 |
| 2013/0033450 A1* | 2/2013 | Coulson ............ | G06F 3/041 345/174 |
| 2013/0257817 A1* | 10/2013 | Yliaho ............. | G06F 3/043 345/177 |
| 2013/0278542 A1* | 10/2013 | Stephanou ........ | G06F 3/0414 345/174 |
| 2016/0306393 A1* | 10/2016 | Huitema .......... | G06F 1/1684 |

(Continued)

*Primary Examiner* — Thuy N Pardo
(74) *Attorney, Agent, or Firm* — Idea Intellectual Limited; Margaret A. Burke; Sam T. Yip (57) ABSTRACT

The present invention provides a low-pressure capacitive tactile sensor for measuring tactile pressures in a range of approximately 0.5 kPa to approximately 20 kPa, the sensor including a first flexible electrode layer; a second flexible electrode layer; a micro-patterned, discontinuous, flexible, UV-curable in approximately 60 seconds or less, elastic polymer nano-imprinted dielectric layer; and a ground shielding layer disposed above the first flexible electrode layer and below the second flexible electrode layer of the capacitive tactile sensor respectively to minimize electromagnetic and capacitive interference. The pressure sensing range of the capacitive tactile sensor is approximately 0.5-20 kPa, the sensitivity is approximately greater than 0.12 pF/kPa. A method for fabricating the capacitive tactile sensor is also provided.

17 Claims, 6 Drawing Sheets

(56) References Cited

U.S. PATENT DOCUMENTS

| | | | |
|---|---|---|---|
| 2017/0010707 A1* | 1/2017 | Son | H05K 1/0296 |
| 2017/0068318 A1* | 3/2017 | McClure | G06F 3/016 |
| 2017/0090618 A1* | 3/2017 | Qiao | G06F 1/1626 |
| 2017/0371465 A1* | 12/2017 | Ahn | G06F 3/041 |
| 2018/0035888 A1* | 2/2018 | Irazoqui | A61B 3/16 |
| 2019/0079629 A1* | 3/2019 | Liu | G06F 3/0412 |
| 2020/0081566 A1* | 3/2020 | Dahiya | G01L 5/228 |
| 2020/0141818 A1* | 5/2020 | Bao | H01G 4/33 |
| 2020/0186179 A1* | 6/2020 | Horiuchi | H01Q 1/273 |
| 2020/0237218 A1* | 7/2020 | Irazoqui | A61B 3/16 |

* cited by examiner

LOW-PRESSURE CAPACITIVE TACTILE SENSOR AND METHOD FOR FABRICATING THE SAME

CROSS-REFERENCE TO RELATED APPLICATION

The present application claims priority from the U.S. provisional patent application Ser. No. 62/917,644 filed Dec. 21, 2018, the disclosure of which is incorporated herein by reference in its entirety.

FIELD OF THE INVENTION

The present invention relates to a low-pressure capacitive tactile sensor, a capacitive tactile sensor system, the method for fabricating a capacitive tactile sensor, and applications of the capacitive tactile sensor or the sensor system.

BACKGROUND

The development of electronic skin has received increasing attention in research and industry. Intelligent robot skin with pressure sensing capability can help robots operate in unknown environments and safely interact with people and objects. In order to make robot skin having sensory functions similar to human skin, research has focused on sensing devices with higher sensitivity. A tactile sensor is a device which can measure the physical information between the body of the device and environment, and the sensor plays an important role in the process of developing robots. In addition, tactile sensors can also be incorporated in everyday objects such as elevator buttons, mobile phones, computer hardware, or household appliances and in various technical fields such as human health assessment, flexible touch screens and displays, and security systems.

Tactile sensors can rapidly and accurately convert low pressure signals such as touch-based tactile signals into electrical signals by signal transmission. According to different principles of operation, tactile sensors are mainly classified into four types, including piezoresistive, piezoelectric, capacitive and elasto-resistive tactile sensors. Among them, the capacitive tactile sensors and the piezoresistive tactile sensors have been the most widely studied.

Piezoresistive tactile sensors operate by exploiting the piezoresistive effect of a material. Many metal materials and semiconductor materials possess a piezoresistive property. When a piezoresistive tactile sensor is subjected to external force, its internal structure and appearance will change, thereby changing the resistance of the piezoresistive component. However, piezoresistive pressure sensors suffer from signal drift due to temperature changes and are high in power consumption.

Capacitive tactile sensors utilize a change in capacitance as a measure of force. Compare to the resistive sensors, capacitive pressure sensors have the advantages of temperature independence, low power consumption and stability against long-term signal drift. An example of a capacitive sensor is depicted in U.S. Pat. No. 7,609,178. The '178 patent discloses a reconfigurable tactile input device includes a first rigid electrode layer, a second flexible electrode layer, and a compressible dielectric structure separating the first and second electrode layers. The dielectric structure is a matrix of compressible geometric elements. While the disclosed pressure sensor is useful in small-scale applications such as the disclosed keypad, robotic skins and other advanced applications require large-area, flexible, highly sensitive, and reproduceable arrays of capacitive sensors. Thus, there is a need in the art for improved capacitive pressure sensors that can be inexpensively and reproduceably fabricated for large-scale arrays.

SUMMARY OF THE INVENTION

Accordingly, an object of this invention is to provide a low-pressure capacitive tactile sensor for measuring tactile pressures.

The second object of the present invention is to provide a capacitive tactile sensor system for measuring tactile pressures.

The third object of the present invention is to provide a method for fabricating a capacitive tactile sensor.

In a first aspect, the present invention provides a low-pressure capacitive tactile sensor for measuring tactile pressures in a range of approximately 0.5 kPa to approximately 20 kPa, the sensor including a first flexible electrode layer comprising one or more first thin film electrode layers positioned on a first flexible substrate; a second flexible electrode layer comprising one or more second thin film electrode layers positioned adjacent on a second flexible substrate, wherein the second electrode layer is approximately parallel to the first electrode layer; a micro-patterned, discontinuous, flexible, UV-curable in approximately 60 seconds or less, elastic polymer nano-imprinted dielectric layer positioned between the first electrode layer and the second electrode layer, wherein the first flexible substrate with the first electrode layer is laminated on top of the dielectric layer, wherein the dielectric layer is laminated on top of the second electrode layer, wherein the scale of a pattern of the micro-patterned discontinuous dielectric layer is 1-100 µm; and a ground shielding layer disposed above the first flexible electrode layer and below the second flexible electrode layer of the capacitive tactile sensor respectively to minimize electromagnetic and capacitive interference. The pressure sensing range of the capacitive tactile sensor is approximately 0.5-20 kPa, the sensitivity is approximately greater than 0.12 pF/kPa.

BRIEF DESCRIPTION OF THE DRAWINGS

Embodiments of the present invention are described in more detail hereinafter with reference to the drawings, in which.

DETAILED DESCRIPTION

In the following description, the present low-pressure capacitive tactile sensor, a capacitive tactile sensor system, and the method for fabricating a capacitive tactile sensor are set forth as preferred examples. It will be apparent to those skilled in the art that modifications, including additions and/or substitutions may be made without departing from the scope and the spirit of the invention, as set forth in the appended claims. Specific details may be omitted so as not to obscure the invention; however, the disclosure is written to enable one skilled in the art to practice the teachings herein without undue experimentation.

The present invention provides a low-pressure capacitive tactile sensor for measuring tactile pressures in a range of approximately 0.5 kPa to approximately 20 kPa, the sensor including a first flexible electrode layer comprising one or more first thin film electrode layers positioned on a first flexible substrate; a second flexible electrode layer comprising one or more second thin film electrode layers positioned adjacent on a second flexible substrate, wherein the second electrode layer is approximately parallel to the first electrode layer; a micro-patterned, discontinuous, flexible, UV-curable in approximately 60 seconds or less, elastic polymer nano-imprinted dielectric layer positioned between the first electrode layer and the second electrode layer, wherein the first flexible substrate with the first electrode layer is laminated on top of the dielectric layer, wherein the dielectric layer is laminated on top of the second electrode layer, wherein the scale of a pattern of the micro-patterned discontinuous dielectric layer is 1-100 µm; and a ground shielding layer disposed above the first flexible electrode layer and below the second flexible electrode layer of the capacitive tactile sensor respectively to minimize electromagnetic and capacitive interference. The pressure sensing range of the capacitive tactile sensor is approximately 0.5-20 kPa, the sensitivity is approximately greater than 0.12 pF/kPa.

The present invention also provides a capacitive tactile sensor system for measuring tactile pressures in a range of approximately 0.5 kPa to approximately 20 kPa, comprising a plurality of the capacitive tactile sensors arranged in an array of rows and columns.

The present invention further provides a method for fabricating the capacitive tactile sensor, the method includes (1) providing a UV-curable elastic polymer layer, the UV-curable elastic polymer layer having a curing time of approximately 60 seconds or less; (2) nanoimprinting the UV-curable elastomeric layer to form a micro-patterned discontinuous dielectric layer having a micro-pattern scale of approximately 1-100 µm; (3) UV curing the micro-patterned discontinuous dielectric layer; providing a first flexible electrode layer and a second flexible electrode layer, wherein the first flexible electrode layer comprises one or more first flexible electrodes positioned on a first flexible substrate and the second flexible electrode layer comprises one or more second flexible electrodes positioned on a second flexible substrate; (4) providing a first flexible electrode layer and a second flexible electrode layer, wherein the first flexible electrode layer comprises one or more first flexible electrodes positioned on a first flexible substrate and the second flexible electrode layer comprises one or more second flexible electrodes positioned on a second flexible substrate; (5) laminating the first flexible electrode layer to a first side of the micro-patterned discontinuous dielectric layer to form a first electrode-dielectric laminate; (6) laminating the first electrode-dielectric laminate to the second flexible electrode layer; and (7) positioning a ground shielding layer adjacent to each of the first flexible electrode layer and the second flexible electrode layer respectively.

Figure 1:
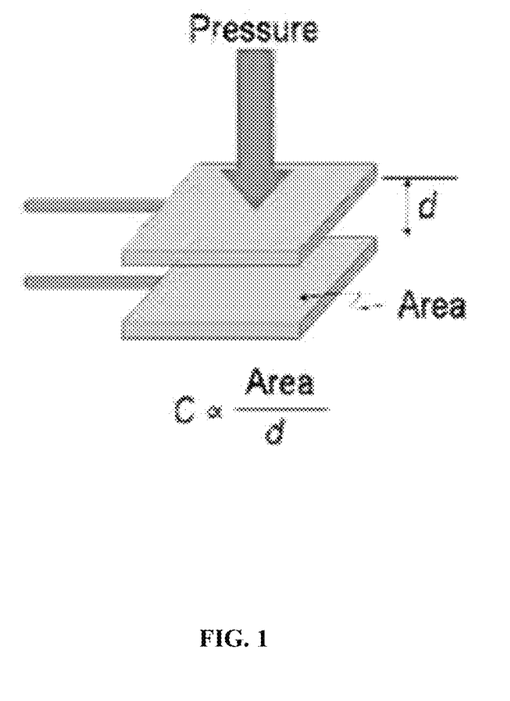
FIG. 1 depicts the working principle of capacitive sensors.

Capacitive pressure sensors apply the principle of parallel plate capacitance, as seen in FIG. 1. Two electrically-conductive plates are separated by a dielectric. In FIG. 1, this dielectric is air, but it may also be a solid dielectric material. When pressure is applied to one of the parallel plates, the capacitance changes in proportion to the distance between the parallel plates. When a solid material is positioned between the parallel plates, as in many pressure sensors, the elasticity of the solid material may be used to return the plates to their original position such that they can measure future changes in pressure. However, when a solid material is used as the dielectric layer, there is room for the displacement of the solid material, meaning that larger forces are needed to displace one of the parallel plates. As a result, the pressure sensor can only measure the relatively higher forces that are required to compress the solid dielectric layer.

Figure 2:
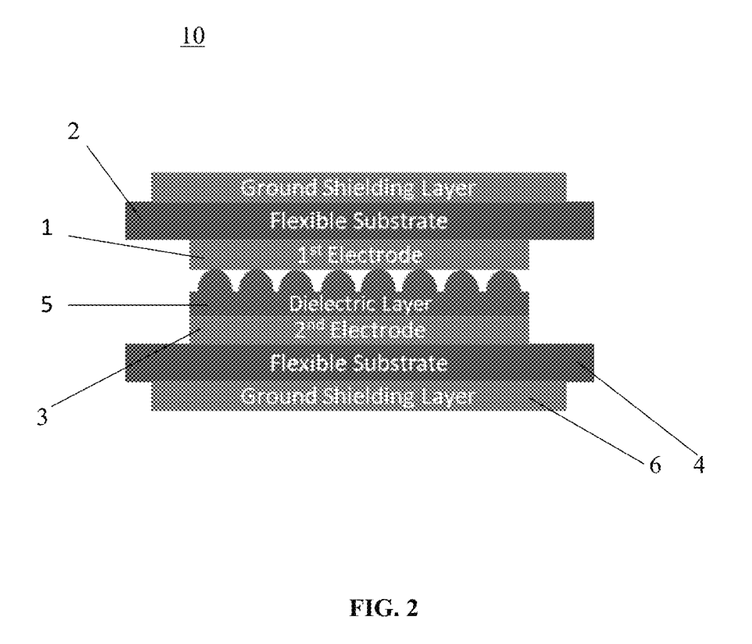
FIG. 2 schematically depicts a pressure sensor according to an embodiment.

Turning to the drawings in detail, FIG. 2 schematically depicts a capacitive pressure sensor 10, according to an embodiment of the present invention. In the pressure sensors of the present invention, the dielectric layer is discontinuous, reducing the amount of force required to displace one of the parallel plates. When discrete structures are used as the dielectric layer, there is sufficient room around each structure to accommodate compressed material, meaning that lower levels of force result in measurable plate displacement.

The capacitive pressure sensor 10 is a flexible sensor that includes a first electrode layer 1 positioned on a first flexible substrate 2. As an example, the first electrode layer may be a conductive metal such as copper or conductive ink deposited on a flexible substrate such as a flexible printed circuit board or polymeric materials such as polyethylene (PE), biaxially oriented polypropylene, polyethylene terephthalate, polyether ketone, or polyvinyl chloride. Similarly, a second electrode layer 3 may be positioned on a second flexible substrate 4 and may be selected from similar conductive and polymeric materials.

Figure 3:
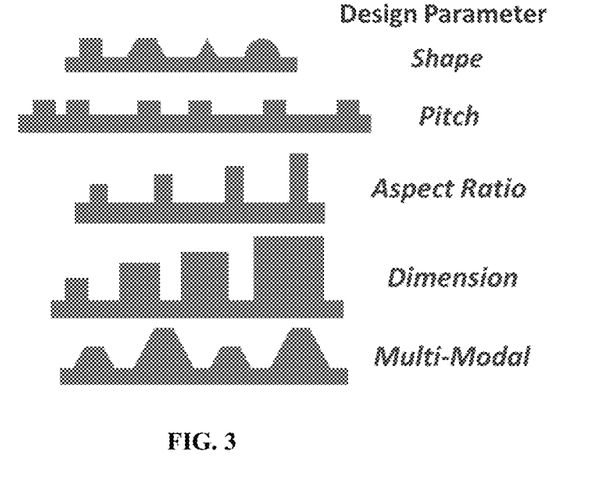
FIG. 3 depicts variations for a dielectric layer.

Positioned between the first and second electrode layers is a micro-patterned, discontinuous dielectric layer. The layer is composed of discrete structures that may be selected from a variety of shapes. As seen in FIG. 2, the shapes may be discrete hemispheres; however, as seen in FIG. 3, a variety of other shapes may be used, such as pyramids, truncated pyramids cubes, cylinders, cones, prisms, hemispheres, domes, or a combination thereof. The selection of dielectric shapes and other dielectric layer features such as dimensions, pitch, aspect ratio, etc. is made in accordance with the desired overall sensor properties, such as targeted pressure range, sensitivity, etc. As will be appreciated by examining the shapes of FIG. 3, some shapes will be more easily compressible, e.g., pyramids, and may be used for lower-pressure applications while other shapes such as prisms, may be more resistant to compression and would have a higher range of pressure-sensing. Also, the shape may be selected to decrease the period of time for the sensor to recover its original, unloaded, shape. This will increase the ability of the sensor to accurately record rapid changes in applied pressure. The patterned dielectric layer also exhibits low hysteresis as compared to a solid-layer dielectric. Selection of pitch also has an effect on sensor sensitivity. A dielectric layer with a large pitch micro-pattern will have a higher sensitivity and lower force sensing range then a small pitch one due to the increase in compressibility. Several types of patterns may be combined in the dielectric layer to extend the sensing range while maintaining the sensor sensitivity.

As will be described below, the dielectric layer is made by a nanoimprinting technique. In order for the fabrication technique to be applicable to large-scale sensor arrays, the dielectric layer is a UV-curable elastic polymer, with a rapid cure time of approximately 60 seconds or less or, more particularly, 30 seconds or less. A variety of UV-curable polymers may be used including polyether, polyester, alkenes, olefins, urethanes, silicone with acrylate or epoxy as end groups, blends of vinyl silicone oil, silicone polymers with a H group, or combinations thereof.

In order to increase the accuracy of pressure sensor 10, shielding layers 6 are disposed surrounding the sensor, over the flexible substrates upon which the electrodes are deposited. The shielding layers 6 may be thin, flexible metal foils or, alternatively, may be thin films deposited on the flexible substrate surfaces opposite to the electrode layers. Other shielding layers may also be used. In particular, the shielding layers 6 block environmental interference from affecting capacitance measurements. Environment interference includes human capacitance, radiated electromagnetic signals, and noise from other electronic devices. Such interference will be blocked by the shielding layer, while the sensor 10 is unaffected.

In order to incorporate sensor 10 into large-scale arrays or use with robot sensing skins, the sensor may be both thin and flexible, with thicknesses on the order of approximately 0.5 mm or less. The sensor may be mounted on curved surfaces, for example, surfaces that may be found on wearable devices.

Figure 4:
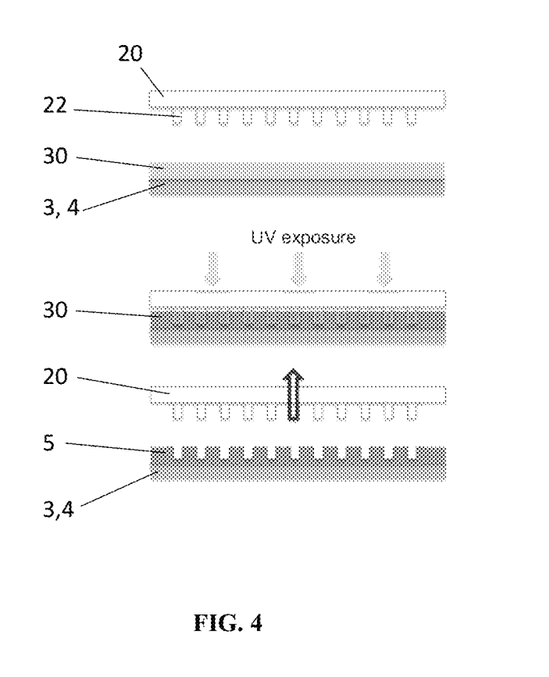
FIG. 4 depicts a printing process for nano-imprinting.

Turning to FIG. 4, a schematic representation of the method of patterning the dielectric layer of the pressure sensor 10 is presented. In FIG. 4, a mold, particularly, a transparent mold, such as a clear silicone mold 20, is provided having a reverse pattern 22 of discrete shapes to be molded into the dielectric layer of the sensor. In the example of FIG. 4, a pattern of prisms will be formed with the size of each prism being the size of the space between adjacent shapes 22. The scale of the pattern that can be produced by a silicone mold 20 is in the micron size range, such as a range of 1 to 100 microns. In the examples below, discrete structures were on the order of approximately 20 to 80 microns.

An uncured resin layer 30 is deposited on each a substrate 4 having an electrode layer 3 deposited thereon. While the numbers used in FIG. 4 represent the second substrate and second electrode, it is understood that the first substrate and first electrode may also be selected for dielectric deposition. The uncured resin is a rapid-curing, UV-curable polymeric material. By "rapid-curing" it is meant that a layer of patterned resin may be cured in approximately 60 seconds or less.

Examples of rapid-curing elastic resins include UV-curable polyurethanes, silicones, fluorinated silicones, nitrile rubber, and silicone rubber. A particular material that may be used is polyether-diacrylate resin. These are rapid curing resins that are UV-curable in approximately 30 seconds or less due to active acrylate end groups. These materials are also elastic due to cross-linking of long chains. They are low-viscosity due to EO functional groups. Formula 1 indicates an example of this material in which the R groups may be hydrogen or $CH_3$, with hydrogen yielding a material that may be dissolved in water and $CH_3$ yielding a hydrophobic material.

Formula 1

Photoinitiators may be added to enhance the UV-sensitivity of monomers and to assist in cross-linking. The UV-curable resins used in the present invention also do not outgas, which is important so that gas bubbles do not form during curing. This leads to highly-reproduceable fabrication of sensors. Other elastic, UV-curable resins may be used in the present invention as long as they are rapidly-curing.

Figure 5:
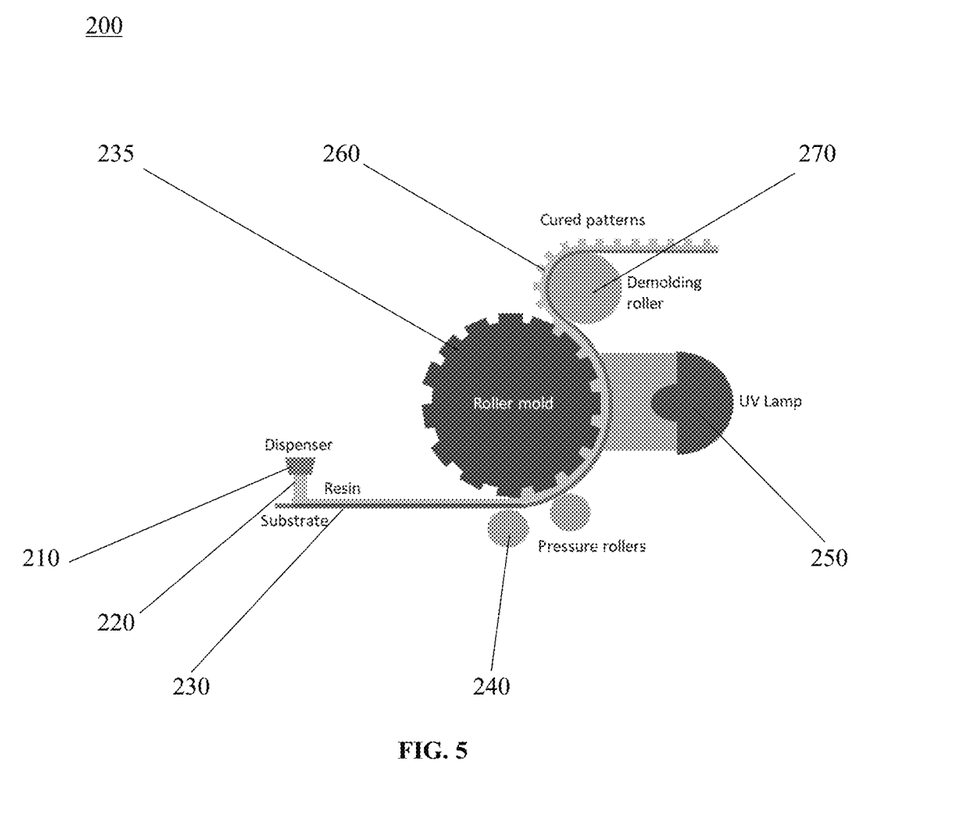
FIG. 5 depicts the working principle of roll-to-roll nano-imprinting.

To produce large-scale patterns, such as large arrays of pressure sensors, a roll-to-roll nanoimprinting technique may be used, as depicted in FIG. 5. This continuous, high-throughput process produces pressure sensors one row at a time, thus the substrate is not subjected to a large degree of pressure over a large area at a single moment. The technique also produces uniform sensors that do not require calibration of individual sensors against each other in an array. In the roll-to-roll technique of FIG. 5, a curtain of resin 220 is dispensed from dispensing unit 210 and deposited on a flexible substrate 230. Flexible substrate 230 may already include flexible electrode layers previously deposited; optionally, shielding layers may also have been deposited prior to the resin layer 220.

A main mold roller 235 imprints the resin layer 220 with the desired structures (depicted as prisms in FIG. 5) through pressure rollers 240 which are cured by UV lamp 250. A demolding roller 270 receives the substrate 230 with cured patterns 260 for later assembly into a sensor with the facing electrode, substrate, and shielding layers.

Figure 6:
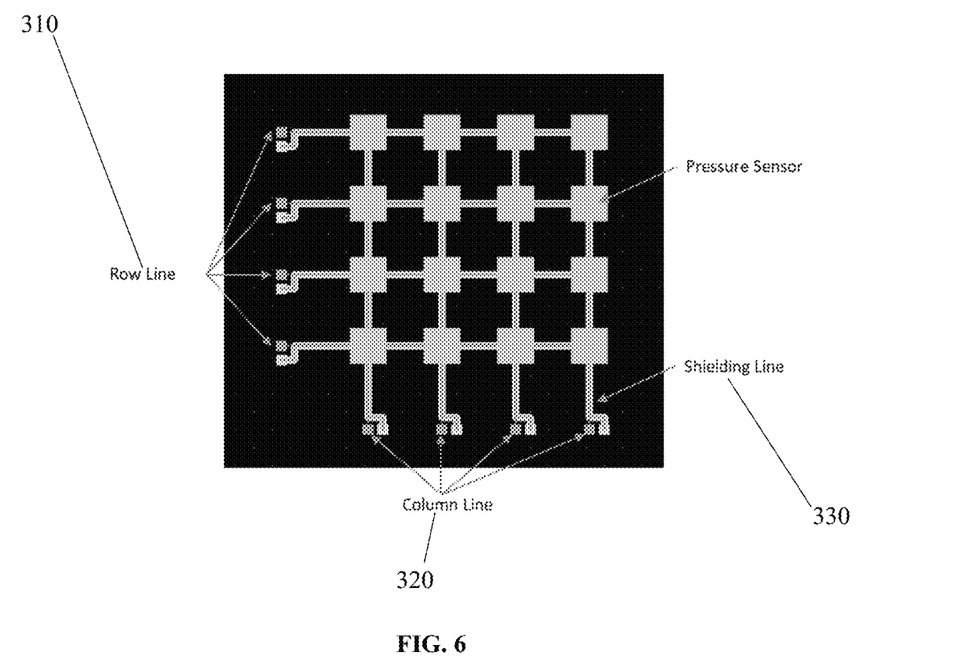
FIGS. 6 and 7 depict capacitive pressure sensor arrays.
Figure 7:
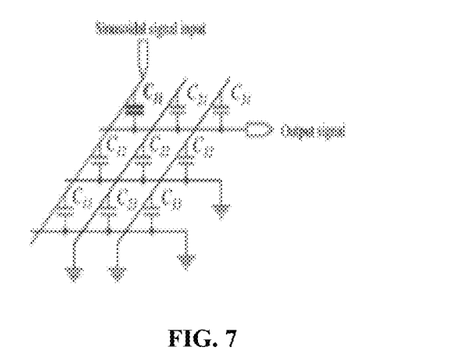

An example of a sensor array using the pressure sensors of the present invention is depicted in FIGS. 6 and 7. In FIG. 6, a series of row lines is formed 310 is formed in the horizontal direction while a series of column lines 320 is formed in the vertical direction. Ground shielding lines 330 are also provided on the row and column lines to block interference. The first electrode of each pressure sensor 10 in the same column is connected electrically with a common column line; similarly, the second electrode of each pressure sensor in the same row is connected to a common row line. The capacitance of each sensor is independently measured by the row-column scanning method indicated in FIG. 7. Circuitry connected to the array scans the sensors according to row-column addresses. In this way, the pressure variations over large areas may be measured.

Figure 8:
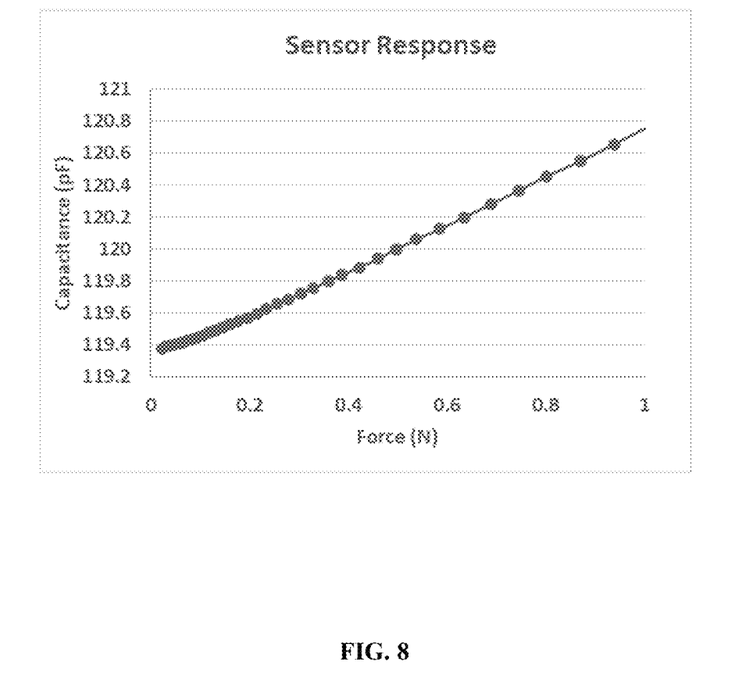
FIG. 8 depicts (graphs relating to sensitivity of fabricated sensors)

FIG. 8 depicts sensor response of the sensor of FIG. 2 for a sensor size of 1 cm×1 cm and $1N/cm^2$ is equal to 10 kPa. The sensitivity of the sensor is the slope of the FIG. 8 curve. The calculated sensitivity is approximately 0.13 pF/kPa. This high level of sensitivity allows the sensors of the present invention to be used in low-load pressure measuring applications such as tactile pressure sensors measuring levels of human touch or attempting to replicate levels of human touch (haptic applications), e.g., robot gripping applications. The pressure sensors may be used for body pressure mapping in medical applications as they can be made to conform to body parts with complex shapes due to their high degree of flexibility. For example, tactile gloves incorporating the pressure sensors of the present invention may be used to design robot gripping elements that replicate the various pressures exerted by human fingers as they manipulate target objects.

DEFINITIONS

Throughout this specification, unless the context requires otherwise, the word "comprise" or variations such as "comprises" or "comprising", will be understood to imply the inclusion of a stated integer or group of integers but not the exclusion of any other integer or group of integers. It is also noted that in this disclosure and particularly in the claims and/or paragraphs, terms such as "comprises", "comprised", "comprising" and the like can have the meaning attributed to it in U.S. Patent law; e.g., they allow for elements not explicitly recited, but exclude elements that are found in the prior art or that affect a basic or novel characteristic of the present invention.

Furthermore, throughout the specification and claims, unless the context requires otherwise, the word "include" or variations such as "includes" or "including", will be understood to imply the inclusion of a stated integer or group of integers but not the exclusion of any other integer or group of integers.

In the methods of preparation described herein, the steps can be carried out in any order without departing from the principles of the invention, except when a temporal or operational sequence is explicitly recited. Recitation in a claim to the effect that first a step is performed, and then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E, and that the sequence still falls within the literal scope of the claimed process. A given step or sub-set of steps can also be repeated. Furthermore, specified steps can be carried out concurrently unless explicit claim language recites that they be carried out separately.

References in the specification to "one embodiment", "an embodiment", "an example embodiment", etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Other definitions for selected terms used herein may be found within the detailed description of the present invention and apply throughout. Unless otherwise defined, all other technical terms used herein have the same meaning as commonly understood to one of ordinary skill in the art to which the present invention belongs.

It will be appreciated by those skilled in the art, in view of these teachings, that alternative embodiments may be implemented without deviating from the spirit or scope of the invention, as set forth in the appended claims. This invention is to be limited only by the following claims, which include all such embodiments and modifications when viewed in conjunction with the above specification and accompanying drawings.

The invention claimed is:

1. A low-pressure capacitive tactile sensor for measuring tactile pressures in a range of approximately 0.5 kPa to approximately 20 kPa, the sensor comprising:
a first flexible electrode layer comprising one or more thin film electrode layers positioned on a first flexible substrate;
a second flexible electrode layer comprising one or more second thin film electrode layers positioned adjacent on a second flexible substrate, wherein the second electrode layer is approximately parallel to the first electrode layer;
a micro-patterned, discontinuous, flexible, UV-curable in approximately 60 seconds or less, elastic nano-imprinted polymer dielectric layer positioned between the first electrode layer and the second electrode layer, wherein the first flexible substrate with the one or more first flexible electrode layer is laminated to a first side of the micro-patterned polymer dielectric layer, wherein the micro-patterned polymer dielectric layer is laminated to the second electrode layer, wherein the scale of a pattern of the micro-patterned discontinuous dielectric layer is 1-100 μm, and
a ground shielding layer disposed above the first flexible electrode layer and below the second flexible electrode layer of the capacitive tactile sensor respectively to minimize electromagnetic and capacitive interference,
wherein the pressure sensing range of the capacitive tactile sensor is approximately 0.5-20 kPa, the sensitivity is approximately greater than 0.12 pF/kPa.

2. The capacitive tactile sensor according to claim 1, wherein the UV-curable elastic polymer comprises polyether, ester, alkenes, olefins, urethane, silicone with acrylate or epoxy as end groups, blend of vinyl silicone oil, silicone polymer with a H group, or combination thereof.

3. The capacitive tactile sensor according to claim 1, wherein a thickness of the dielectric layer is less than approximately 0.5 mm.

4. The capacitive tactile sensor according to claim 1, wherein a structure of the micro-patterned dielectric is a pattern of cubes, cylinders, cones, pyramids, prisms, hemispheres, domes, or a combination thereof.

5. The capacitive tactile sensor according to claim 1, wherein the sensing range and the sensitivity of the capacitive tactile sensor are adjusted according to a dimension and pitch of the micro-patterned discontinuous dielectric layer.

6. A capacitive tactile sensor system for measuring tactile, pressures in a range of approximately 0.5 kPA to approximately 20 kPa, comprising including a plurality of the sensors of claim 1 arranged in an array of rows and columns.

7. The capacitive tactile sensor system according to claim 6, wherein the first electrodes of each sensor arranged in a same column are connected to a common column line.

8. The capacitive tactile sensor system according to claim 7, wherein the second electrodes of each sensor arranged in a same row are connected to a common row line.

9. The capacitive tactile sensor system according to claim 6, wherein the structure of the micro-patterned dielectric is a pattern of cubes, cylinders, cones, pyramids, prisms, hemispheres, domes, or a combination thereof.

10. The capacitive tactile sensor system according to claim 6, wherein the UV-curable elastic polymer comprises polyether, ester, alkenes, olefins, urethane, silicone with acrylate or epoxy as end groups, blend of vinyl silicon oil, silicone polymer with a H group, or a combination thereof.

11. The capacitive tactile sensor system according to claim 6, wherein the sensing range and the sensitivity of the capacitive tactile sensor system are adjusted according to a dimension and pitch of the micro-patterned discontinuous dielectric layer.

12. The capacitive tactile sensor system according to claim 8, further comprising row-column scanning circuitry to independently measure capacitance of each sensor.

13. A method for fabricating a capacitive tactile sensor according to claim 1, comprising:

providing a UV-curable elastic polymer layer, the UV-curable elastic polymer layer having a curing time of approximately 60 seconds or less;

nanoimprinting the UV-curable elastomeric layer to form a micro-patterned discontinuous dielectric layer having a micro-pattern scale of approximately 1-100 µm;

UV curing the micro-patterned discontinuous dielectric layer;

providing a first flexible electrode layer and a second flexible electrode layer, wherein the first flexible electrode layer comprises one or more first flexible electrodes positioned on a first flexible substrate and the second flexible electrode layer comprises one or more second flexible electrodes positioned on a second flexible substrate;

laminating the first flexible electrode layer to a first side of the micro-patterned discontinuous dielectric layer to form a first electrode-dielectric laminate;

laminating the first electrode-dielectric laminate to the second flexible electrode layer;

positioning a ground shielding layer adjacent to each of the first flexible electrode layer and the second flexible electrode layer respectively.

14. The method according to claim 13, wherein a thickness of the dielectric layer is less than 0.5 mm.

15. The method of claim 13, wherein the nanoimprinting comprises a roll-to-roll nanoimprinting process using a mold having an inverse pattern of structures to be imprinted, the structures selected from one or more of cubes, cylinders, cones, pyramids, prisms, hemispheres, or domes.

16. The method according to claim 13, wherein the nanoimprinting process is conducted at room temperature.

17. The method according to claim 13, wherein the UV-curable elastic polymer comprises polyether, ester, alkenes, olefins, urethane, silicone with acrylate or epoxy as end groups, blend of vinyl silicone oil, silicone polymer with a H group, or combination thereof.

* * * * *